(12) United States Patent
Vasquez et al.

(10) Patent No.: US 10,944,374 B2
(45) Date of Patent: Mar. 9, 2021

(54) ELECTROSTATIC CHUCK FILTER BOX AND MOUNTING BRACKET

(71) Applicant: Lam Research Corporation, Fremont, CA (US)

(72) Inventors: Miguel Benjamin Vasquez, Portland, OR (US); Jeremy Jerome Pool, Sherwood, OR (US); Damien Martin Slevin, Salem, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/906,301

(22) Filed: Jun. 19, 2020

(65) Prior Publication Data

US 2020/0321934 A1    Oct. 8, 2020

Related U.S. Application Data

(63) Continuation of application No. 15/982,972, filed on May 17, 2018, now Pat. No. 10,693,433.

(51) Int. Cl.
*H03H 7/01*    (2006.01)
*H01L 21/683*    (2006.01)
(Continued)

(52) U.S. Cl.
CPC ....... *H03H 7/0138* (2013.01); *H01L 21/6833* (2013.01); *H01R 13/629* (2013.01);
(Continued)

(58) Field of Classification Search
CPC ...... H03H 7/0138; H03H 3/00; H01R 13/629; H01R 43/26; H05K 7/20136; H01L 21/6833
(Continued)

(56) References Cited

U.S. PATENT DOCUMENTS 5,245,527 A    9/1993  Duff
5,737,177 A    4/1998  Mett
(Continued)

FOREIGN PATENT DOCUMENTS

KR    10-0579897    5/2006
KR    10-2007-0022554    2/2007
KR    10-0968940    7/2010

OTHER PUBLICATIONS

International Search Report and Written Opinion from International Application No. PCT/US2019/031725 dated Aug. 23, 2019.

(Continued)

*Primary Examiner* — Rakesh B Patel
*Assistant Examiner* — Jorge L Salazar, Jr.
(74) *Attorney, Agent, or Firm* — Beyer Law Group LLP (57) ABSTRACT

An apparatus and method electrically coupling an electrostatic chuck RF filter box with a pedestal lift. The RF filter box has a contact block and at least one alignment feature on an outer mating surface of the RF filter block. The contact block includes self-aligning electrical connectors and the alignment feature is configured for aligning self-aligning electrical connectors with corresponding electrical connectors on the bracket of the pedestal lift such that the self-aligning electrical connectors and the corresponding electrical connectors on the bracket of the pedestal lift automatically mate when the contact block is mounted to the bracket of the pedestal lift.

19 Claims, 11 Drawing Sheets

(51) Int. Cl.
   *H03H 3/00*       (2006.01)
   *H05K 7/20*       (2006.01)
   *H01R 43/26*      (2006.01)
   *H01R 13/629*     (2006.01)

(52) U.S. Cl.
   CPC ............... *H01R 43/26* (2013.01); *H03H 3/00* (2013.01); *H05K 7/20136* (2013.01)

(58) Field of Classification Search
   USPC .................................................. 333/175, 185
   See application file for complete search history.

(56) References Cited

U.S. PATENT DOCUMENTS 10,693,433  B2 *   6/2020   Vasquez ............. H05K 7/20136
   2008/0182418 A1    7/2008   Collins
   2014/0302256 A1   10/2014   Elwell
   2017/0069464 A1    3/2017   Ye et al.

OTHER PUBLICATIONS

Office Action from U.S. Appl. No. 15/982,972 dated Oct. 21, 2019.
Notice of Allowance from U.S. Appl. No. 15/982,972 dated Feb. 27, 2020.

* cited by examiner

ELECTROSTATIC CHUCK FILTER BOX AND MOUNTING BRACKET

CROSS REFERENCE TO RELATED APPLICATION

This application claims the benefit of U.S. application Ser. No. 15/982,972 filed on May 17, 2018, the entire content of which is incorporated herein by reference thereto.

BACKGROUND

The disclosure relates to a method and apparatus for semiconductor processing. More specifically, the disclosure relates to an electrostatic chuck filter box and mounting bracket for filtering RF signals from other signals.

Semiconductor processing systems, which are used to process substrates such as semiconductor wafers, typically include a substrate support, such as a chuck, for holding a wafer during semiconductor processing. One type of chuck is an electrostatic chuck (ESC), which includes a platen having electrodes that are biased with voltage to produce an electrostatic force between the wafer and platen in order to hold the wafer to the platen. Typically, DC signals are used to control the voltage power supplies for controlling the clamping and de-clamping functions of the ESC.

A radio frequency (RF) filter box is an electromechanical assembly that filters RF signals from other signals, such as sensitive DC signals (from ESC clamping voltage) and AC signals (from the ESC heater). Typically, an RF filter box is electrically coupled with the ESC pedestal lift and uses manual connectors to make each electrical connection separately. The RF filter box must first be mounted to the pedestal lift. Panels on the RF filter box can then be removed to gain access to these manual electrical connections. Manually making these electrical connections requires manipulation of the connecting wires and can be difficult and may not always be consistent. Consistent placement of the wires is critical to the performance of the filtering circuits. Thus, there is a need for an ESC RF filter box that provides a reliable and consistent way to make automatic electrical and mechanical connections.

SUMMARY

According to an embodiment, an electrostatic chuck RF filter box is provided for mounting on a bracket of a pedestal lift to make a plurality of electrical connections. The RF filter box includes at least one contact block and at least one alignment feature. The contact block includes a plurality of self-aligning electrical connectors on a mating surface of the RF filter block. The mating surface is an outer surface of the RF filter box. The alignment feature is on the mating surface of the RF filter box, and is configured for aligning the self-aligning electrical connectors with corresponding electrical connectors on the bracket of the pedestal lift such that the self-aligning electrical connectors and the corresponding electrical connector on the bracket of the pedestal lift automatically mate when the contact block is mounted to the bracket of the pedestal lift.

According to another embodiment, a method is provided for electrically coupling an electrostatic chuck RF filter box with a pedestal lift. An electrostatic chuck RF filter box is provided. The filter box includes at least one contact block and at least one alignment feature. The contact block includes a plurality of self-aligning electrical connectors on an outer mating surface of the RF filter block and the alignment feature is on the outer mating surface of the RF filter box. The alignment feature is configured for aligning the self-aligning electrical connectors with corresponding electrical connectors on the bracket of the pedestal lift such that the self-aligning electrical connectors and the corresponding electrical connectors on the bracket of the pedestal lift automatically mate when the contact block is mounted to the bracket of the pedestal lift. The outer mating surface of the RF filter box is then positioned against a mating surface of a mounting bracket of the pedestal lift by using the at least one alignment feature to engage a corresponding alignment feature on the mounting bracket of the pedestal lift. The RF filter box is then secured to the mounting bracket of the pedestal lift to electrically couple the RF filter box with the pedestal lift, where the plurality of electrical connectors on the RF filter box and the corresponding electrical connectors on the bracket of the pedestal lift automatically mate when the RF filter box is mounted to the pedestal lift.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

With reference to FIGS. 1-9, embodiments of a RF filter box 100 are described. The RF filter box 100 is an electromechanical assembly for mounting on a bracket of a pedestal lift 610 of an ESC to make electrical connections. According to some embodiments, the pedestal lift 610 can be moving. The RF filter box 100 filters RF signals from other signals, such as sensitive DC signals (from ESC clamping) and AC signals (from the heater of the ESC). As described in more detail herein, according to an embodiment, the mechanical portion of the RF filter box 100 employs sockets that are set into custom contact blocks. These sockets are then mated to pins located on the mounting bracket of the pedestal lift assembly to make an automatic electrical connection for the RF, AC, and DC signals. As discussed in more detail below, alignment pins on the RF filter box 100 can be used to help make the mating constituent and reliable. Accurate and repeatable placement of the electrical connections ensure the integrity and reliability of the RF, AC, and DC signals.

Figure 1:
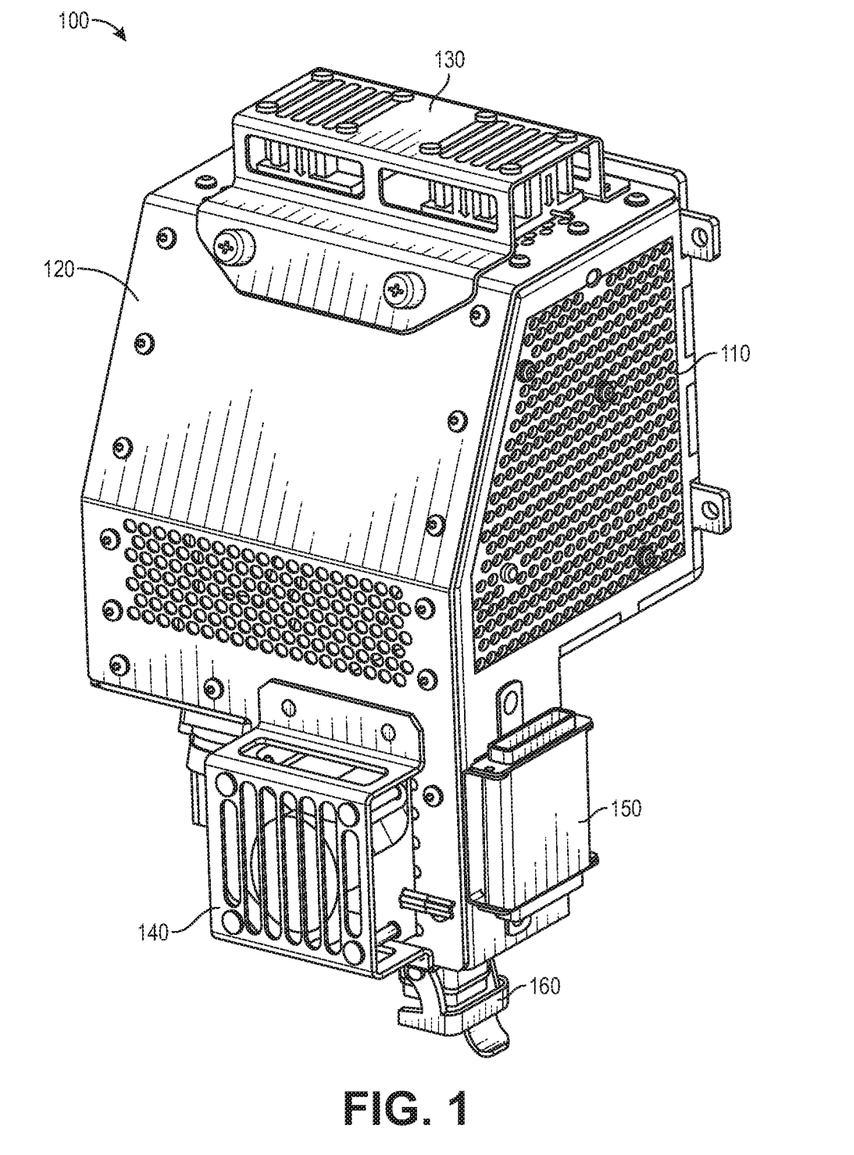
FIG. 1 is a perspective view of the front side of a RF filter box in accordance with an embodiment.
Figure 2:
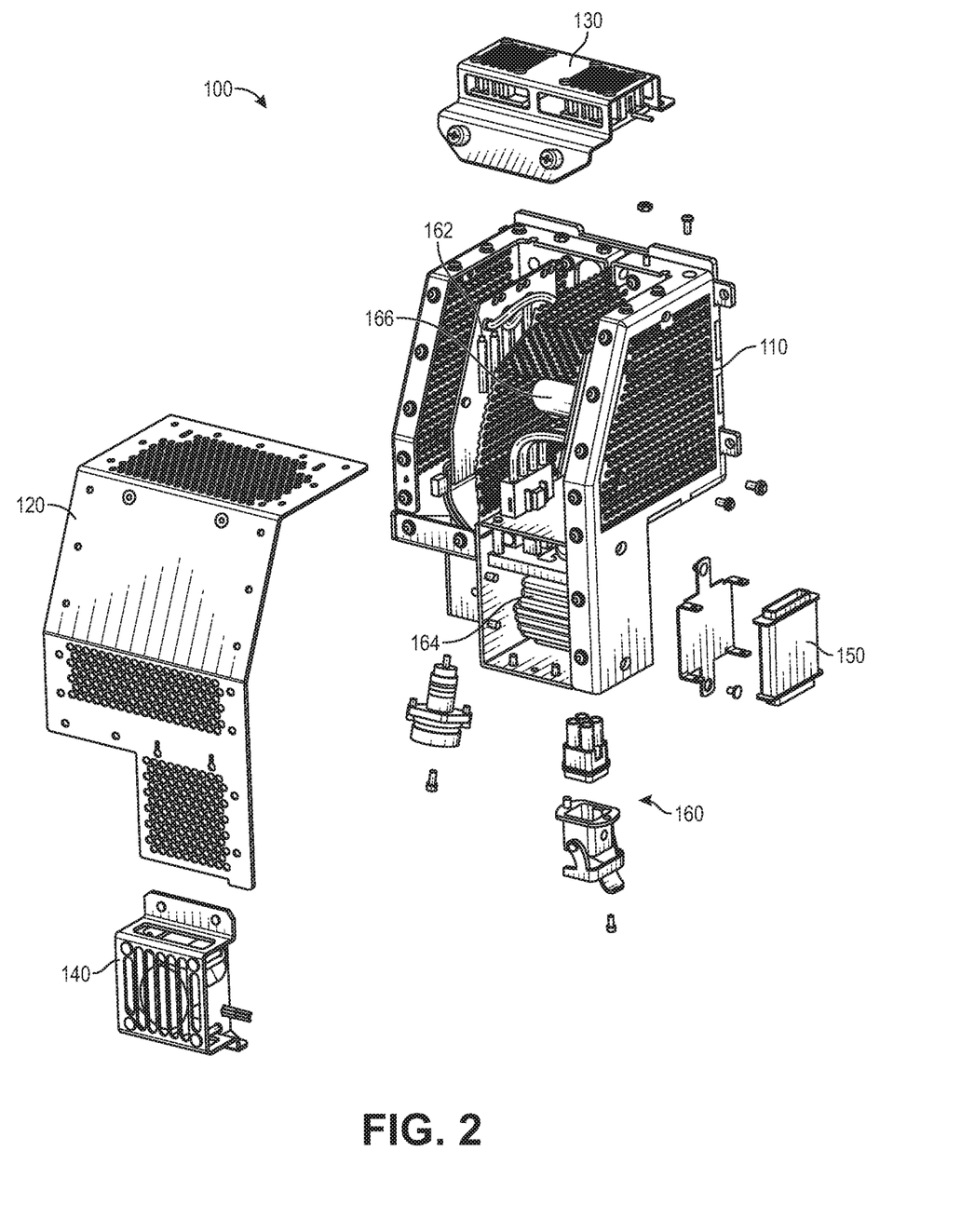
FIG. 2 is an exploded view of the RF filter box shown in FIG. 1.
Figure 3:
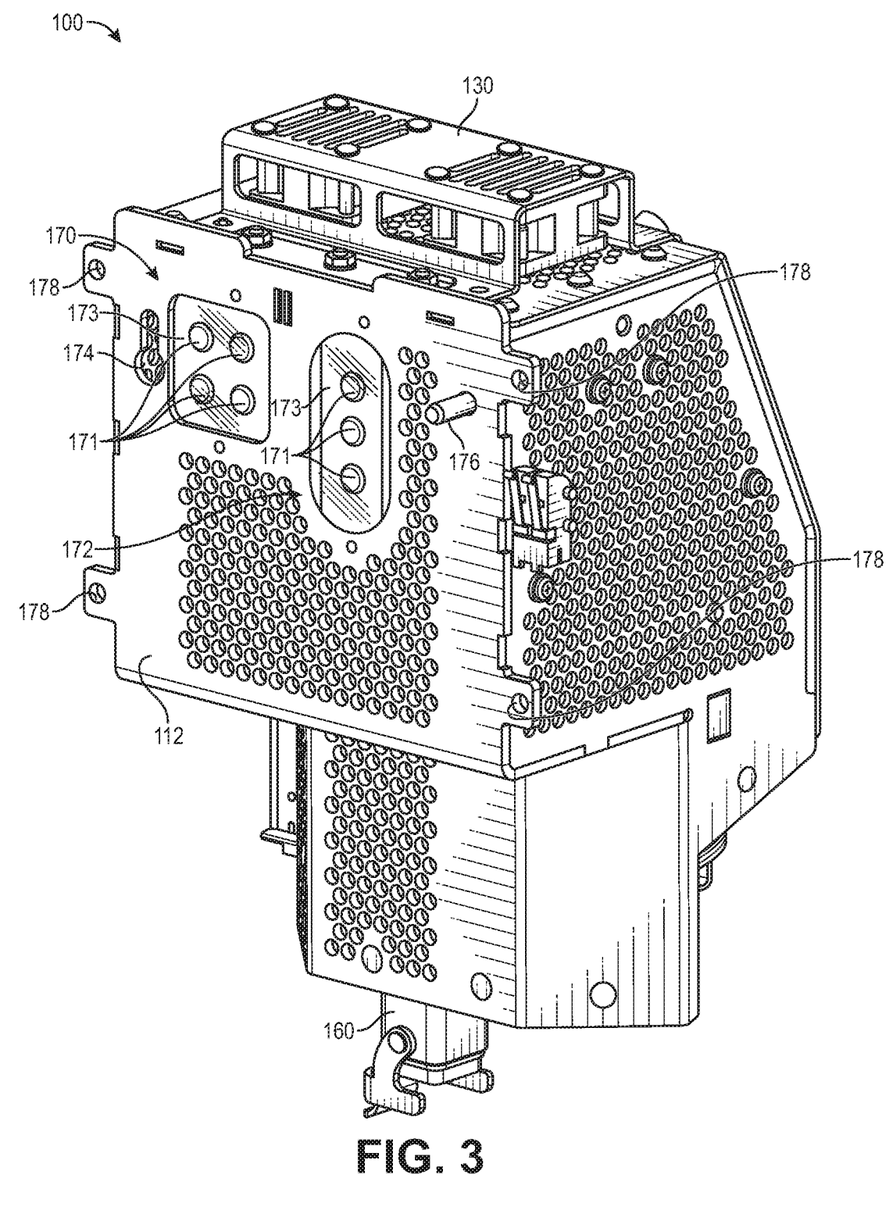
FIG. 3 is a perspective view the back side of the RF filter box shown in FIGS. 1 and 2.
Figure 6:
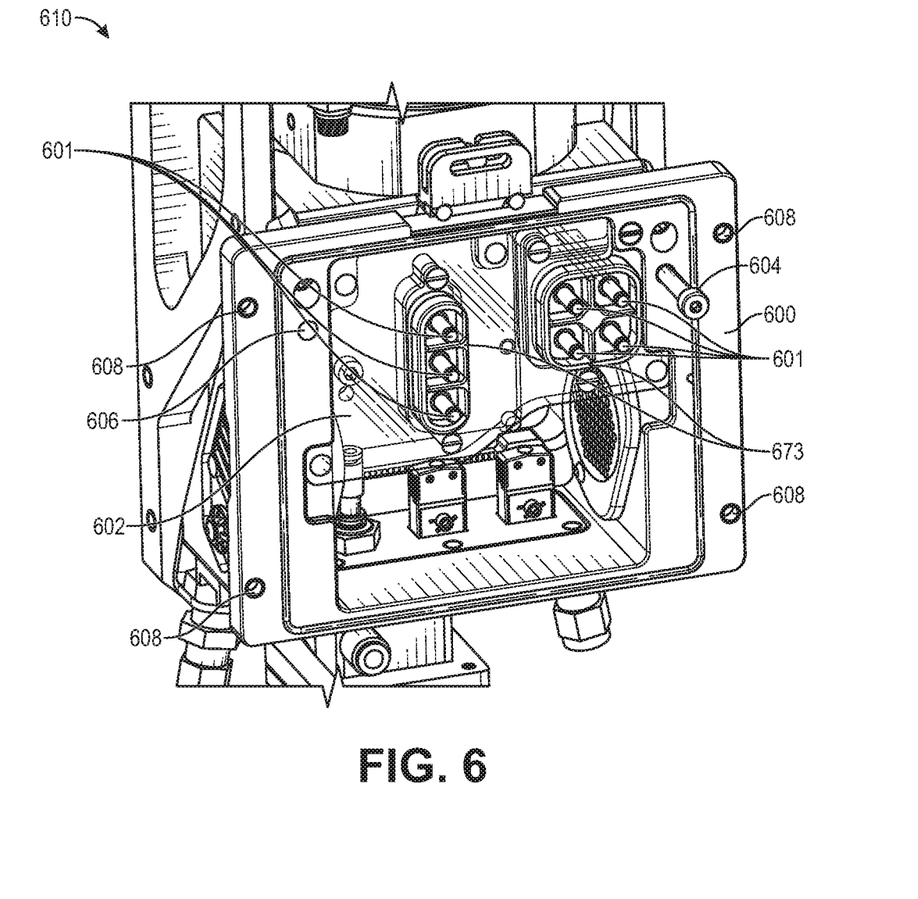
FIG. 6 is a perspective view of the mating side of a mounting bracket on the pedestal lift in accordance with an embodiment.

FIGS. 1-4 show an embodiment of a RF filter box 100 that is configured to be mounted to an ESC pedestal lift mounting bracket (FIG. 6). As shown in FIGS. 1-4, the RF filter box 100 has an enclosure 110 in which wires and other components are housed. The enclosure 110 is closed with an enclosure cover 120 on the front side, as shown in FIGS. 1 and 2. On the back side of the RF filter box 100, as shown in FIG. 3, is the filter box mounting bracket 112. This mounting bracket 112 allows the RF filter box 100 to be mounted to the mounting bracket 600 (FIG. 6) of the pedestal lift 610. The outer surface of the RF filter box 100 includes the enclosure 110, the enclosure cover 120, and the mounting bracket 112. In the illustrated embodiment, the RF filter box 100 also includes several fan assemblies, including the ESC/high frequency (HF) filter fan assembly 130, the low frequency (LF) filter fan assembly 140, and the fan sense assembly 150.

Figure 4:
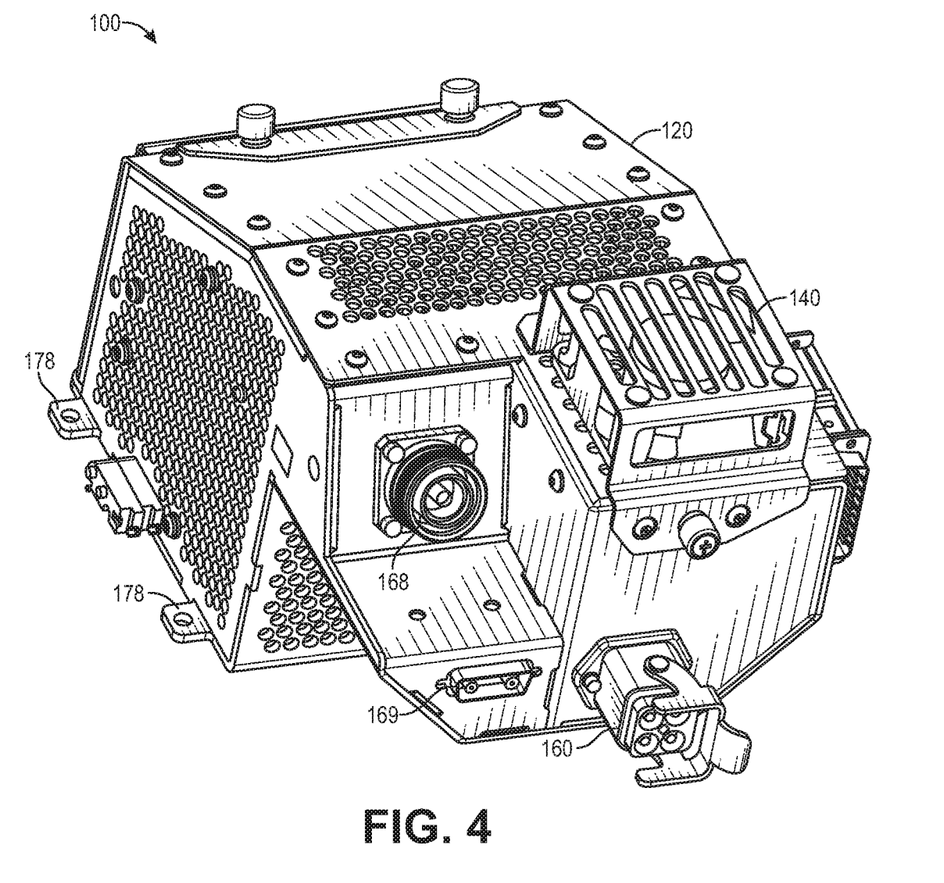
FIG. 4 is perspective view the bottom side of the RF filter box shown in FIGS. 1-3.

As shown in FIGS. 1-4, an AC connector 160 is provided on the RF filter box to receive the AC signals from the heater lines. FIG. 2 is an exploded view of the RF filter box 100 and shows components within the RF filter box 100, including a ESC DC printed circuit board assembly (PCBA) 162, a low frequency RF PCBA 164 for low frequency input, and high frequency RF PCBA 166 for high frequency input. FIG. 4 shows a bottom view of the RF filter box 100 with the AC connector 160, a RF connector 168, and a DC connector 169.

To electrically connect the RF filter box 100 with the pedestal lift 610, the mounting bracket 112 on the back side (mating surface) of the RF filter box 100 is configured to align with and be mounted to a mounting bracket 600 (FIG. 6) on the pedestal lift 610. As shown in FIG. 3, features that help with alignment are provided on the mating surface of the mounting bracket 112. These alignment features include a self-aligning AC connector 170 for AC heater lines, a self-aligning RF connector 172 for RF inputs, a mounting keyway hole 174, a mounting alignment pin 176, and bracket mounting holes 178.

In the illustrated embodiment, a keyway insert 604 is provided to be inserted into and lock with the keyway hole 174 on the mounting bracket 112 of the RF filter box 100. In this embodiment, a hole 606 is also provided on the mating surface of the RF filter box 100, as shown in FIG. 3, to accept the corresponding alignment pin 176 on the mounting bracket 112 of the RF filter box 100. In other embodiments, the mating surface of the mounting bracket 112 may have only one alignment feature, which may be one of an alignment pin, a hole, a keyway insert, and a keyway hole. It will be understood that any suitable alignment feature may be used to align the two mounting brackets 112, 600. According to other embodiments, the mating surface of the mounting bracket 112 may have any number of such alignment features. The alignment features can be provided in any combination, typically with a pin or protrusion on one mating surface (mounting bracket 112) configured to be mated with a corresponding indentation or hole on the other mating surface (mounting bracket 600). These alignment features can be any shape, ranging from a simple circular or cylindrical shape to a more complex shape, such as a keyway hole or the like.

It will be understood that such alignment features are configured to aid in aligning the self-aligning electrical connectors 171 on the mounting bracket 112 with corresponding electrical connectors 601 on the mounting bracket 600 of the pedestal lift 610 such that the self-aligning electrical connectors 171 and the corresponding electrical connectors 601 on the mounting bracket 600 of the pedestal lift 610 automatically mate when the mounting brackets 112, 600 are aligned and their mating surfaces are pushed together. These alignment features make the electrical and mechanical connections between the RF filter box 100 and ESC pedestal lift 610 as automatic and repeatable as possible. The alignment features allow for electrical coupling without the need for manual manipulation of the connecting wires. Consistent placement of the connecting wires is critical to the performance of the filtering circuits.

The keyway hole 174 is configured to accept and lock with the corresponding keyway insert 604 on the pedestal lift mounting bracket 600. Similarly, the pin 176 on the mounting bracket 112 on the RF filter box 100 is configured to be inserted into the corresponding hole 606 in the mounting bracket 600 of the pedestal lift 610. In addition to these alignment features, the mounting bracket 112 is also provided with a self-aligning AC connector 170 and a self-aligning RF connector 172.

Each of the self-aligning AC connector 170 and the self-aligning RF connector 172 includes a contact block 173 having electrical connectors 171 mounted therein. In the illustrated embodiment, the electrical connectors 171 are sockets mounted in the contact blocks 173 and allow automatic electrical connection to pins 601 on the pedestal lift mounting bracket 600 as the RF filter box 100 is mounted to the pedestal lift assembly, which is capable of moving. It will be understood that, in other embodiments, the electrical connectors 171 on the mounting bracket can be pins while the electrical connectors 601 on the pedestal lift mounting bracket 600 can be electrical sockets.

Figure 5A:
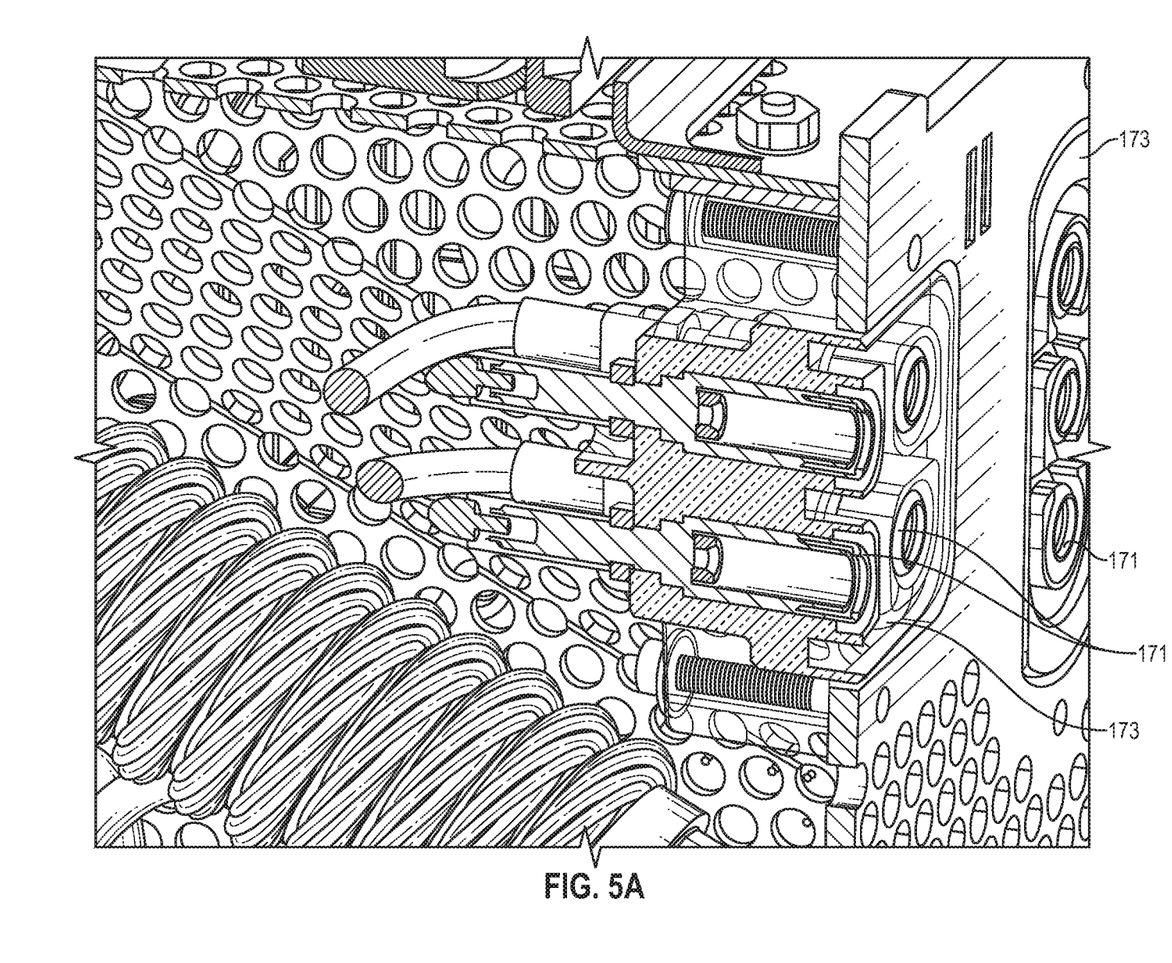
FIG. 5A is a detailed view of an embodiment of a contact block and electrical sockets in the mounting bracket of a RF filter box.
Figure 5B:
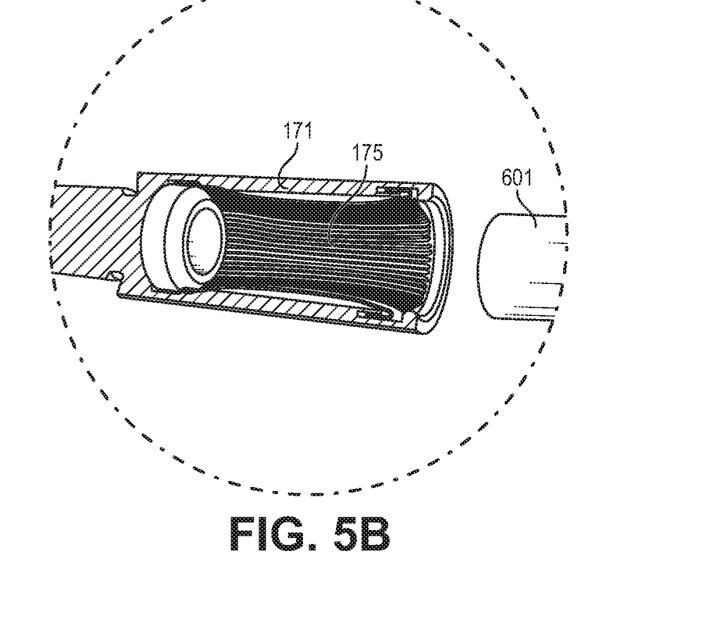
FIG. 5B is a detailed view of one of the electrical sockets shown in FIG. 5A and a corresponding pin.

Each electrical socket 171 is configured to accept a corresponding pin 601 on the pedestal lift mounting bracket 600 to make electrical connections between the RF filter box 100 and the ESC pedestal lift 610. A suitable push-pull socket-pin connector is commercially available from ODU USA, Inc. of Camarillo, Calif. FIGS. 5A and 5B are detailed view of such push-pull socket-pin connectors. FIG. 5A shows multiple electrical sockets 171 set in contact blocks 173. As shown in FIG. 5B, the socket 171 has springwires 175 lining the inner surface of the socket 171 for contact with a pin 601 when the pin 601 is inserted into the socket 171.

The contact blocks 173 on the mounting bracket 112 are formed of an insulating material. According to an embodiment, the contact blocks 173 are formed of Ultem 1000

(UL94 V0), which is a type of amorphous thermoplastic polyetherimide (PEI) resin manufactured by SABIC (Saudi Basic Industries Corporation). Ultem 1000 has a high dielectric strength and heat resistance. It will be understood that the insulating contact blocks 173 have electrical properties for voltage isolation and that the contact blocks 173 can be designed to allow close pin to pin alignment while providing separation for electrical isolation.

In the illustrated embodiment, the self-aligning AC connector 170 and the self-aligning RF connector 172 allow for automatic electrical connection of 3 RF signals and 4 AC signals between the RF filter box 100 and the pedestal lift assembly. It will be understood that, in other embodiments, there may be different numbers of RF and AC signals.

As shown in FIG. 6, the mounting bracket 600 on the pedestal lift 610 is configured to mate with the mounting bracket 112 (mating surface) of the RF filter box 100. The mounting bracket 112 of the RF filter box 100 can be secured to the mounting bracket 600 on the pedestal lift 610 using screws (not shown) threaded through the bracket mounting holes 178 of the mounting bracket 112 of the RF filter box 100 and the corresponding bracket mounting holes 608 of the pedestal lift mounting bracket 600.

In the illustrated embodiment, the contact blocks 673 and electrical pins 601 on the pedestal lift mounting bracket 600 are positioned to mate with the corresponding contact blocks 173 and sockets 171 on the mounting bracket 112 on the RF filter box 100 when the two mounting brackets 112, 600 are aligned. As discussed above, alignment features on the mounting brackets aid in alignment and the electrical sockets 171 are configured to automatically electrically couple with the corresponding pins 601 when the mounting brackets 112, 600 are pushed together after being aligned.

In this embodiment, the mounting bracket 600 is also provided with a snap-in dielectric mounting plate 602 for isolating electrical connections from ground plane and metal walls. As shown in FIG. 6, the contact blocks 673 are mounted in the mounting plate 602. According to an embodiment, the mounting plate 602 is formed of Ultem and nylon fasteners hold the mounting plate 602 to the mounting bracket 600.

Figure 7A:
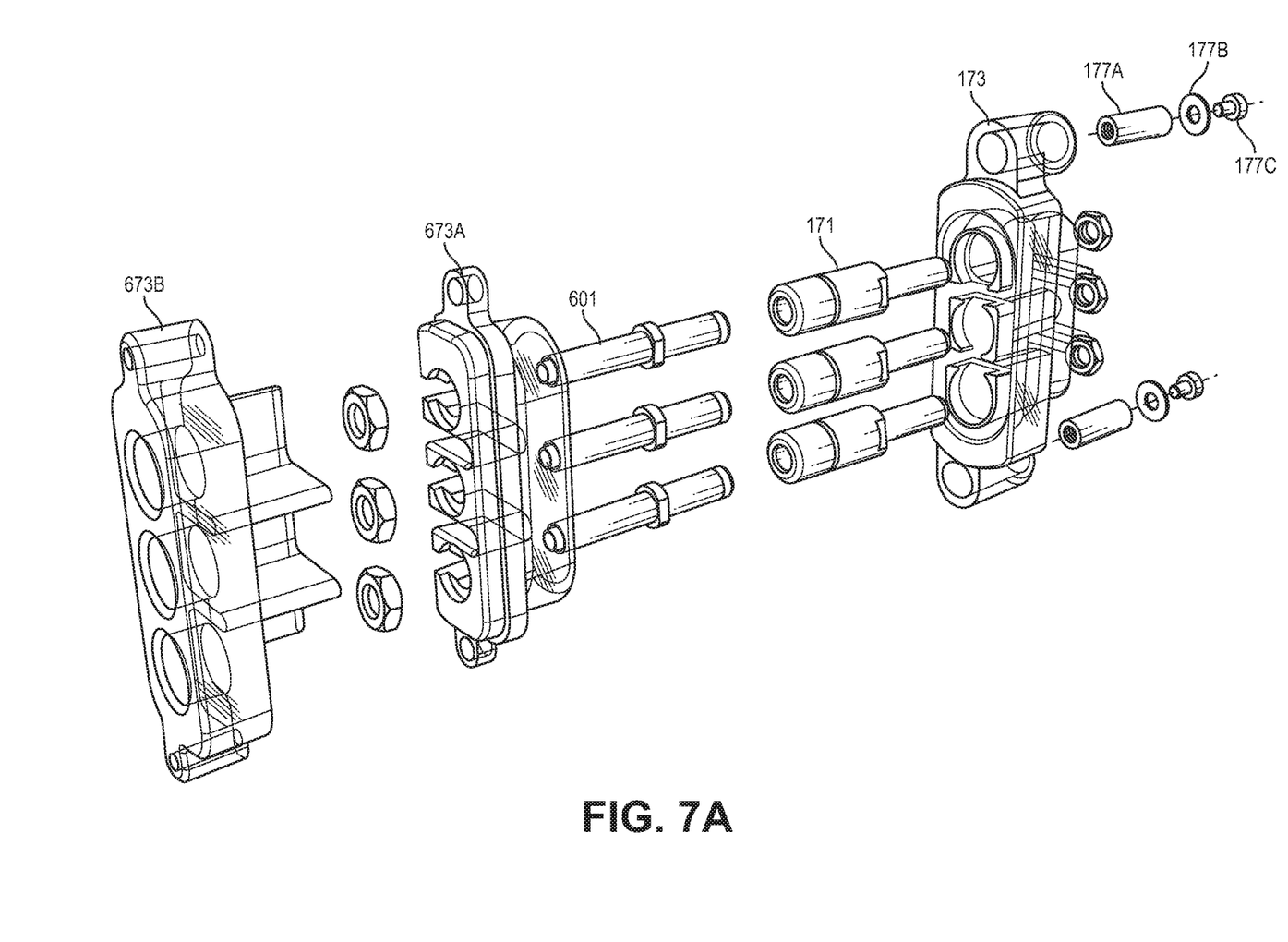
FIG. 7A is a detailed exploded view of contact blocks and electrical sockets and pins for RF signals in accordance with an embodiment.
Figure 7B:
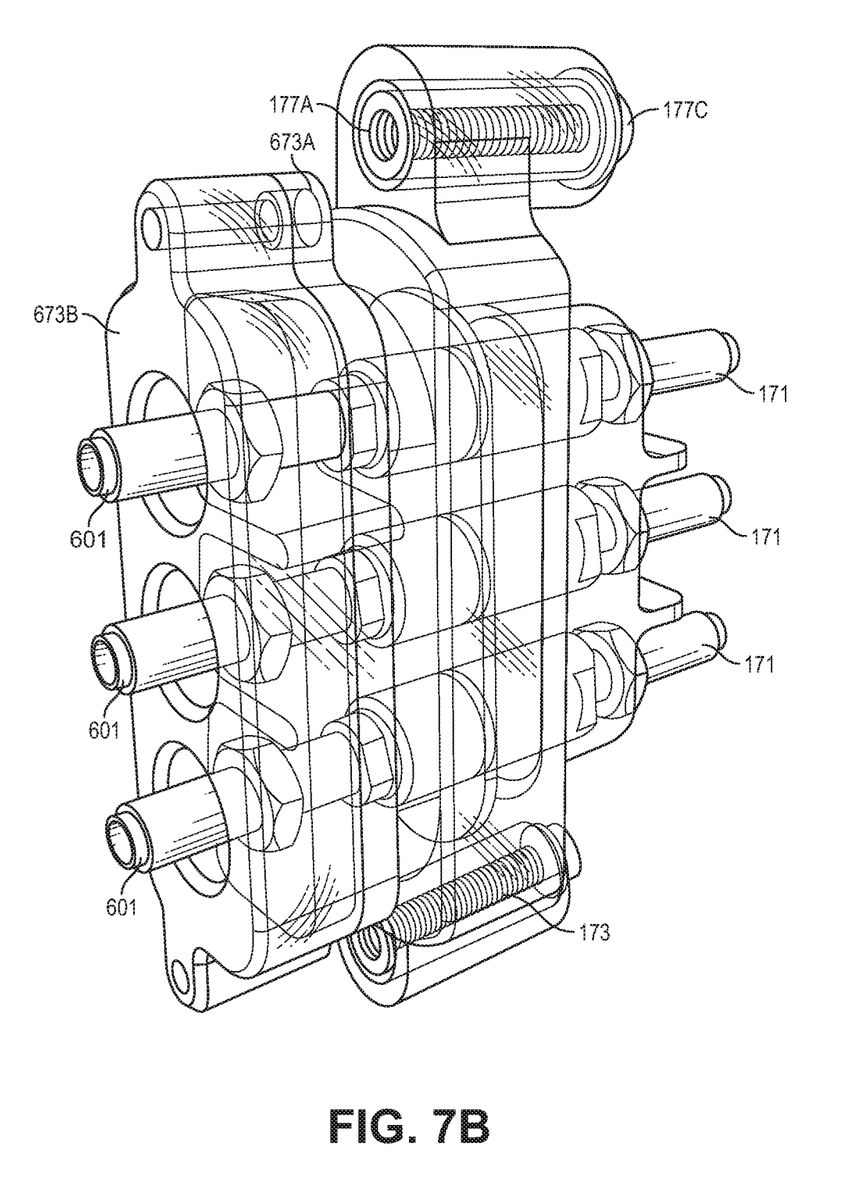
FIG. 7B is a detailed perspective view of the contact blocks and electrical sockets and pins for RF signals shown in FIG. 7A.
Figure 8A:
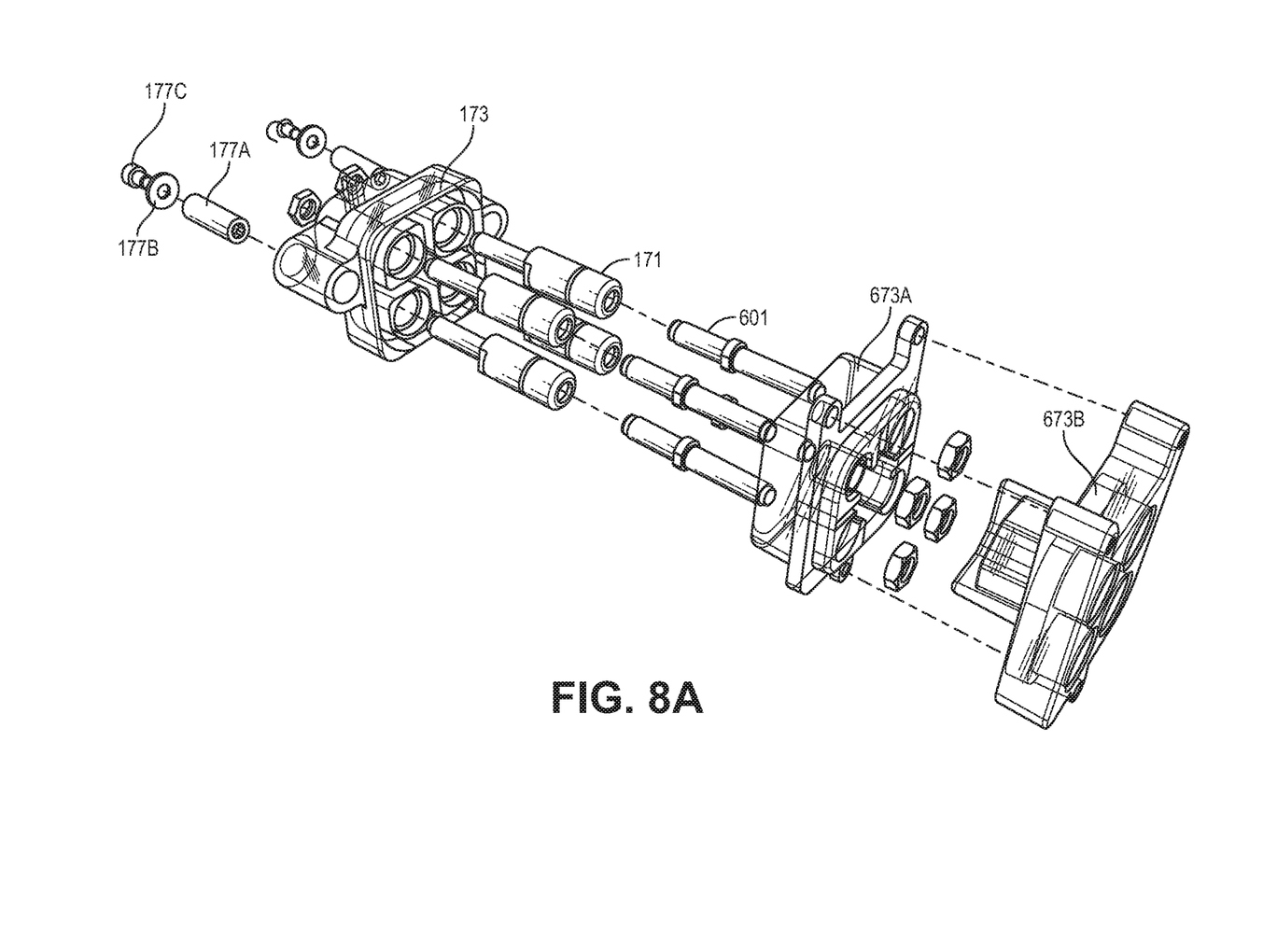
FIG. 8A is a detailed exploded view of contact blocks and electrical sockets and pins for AC signals in accordance with an embodiment.
Figure 8B:
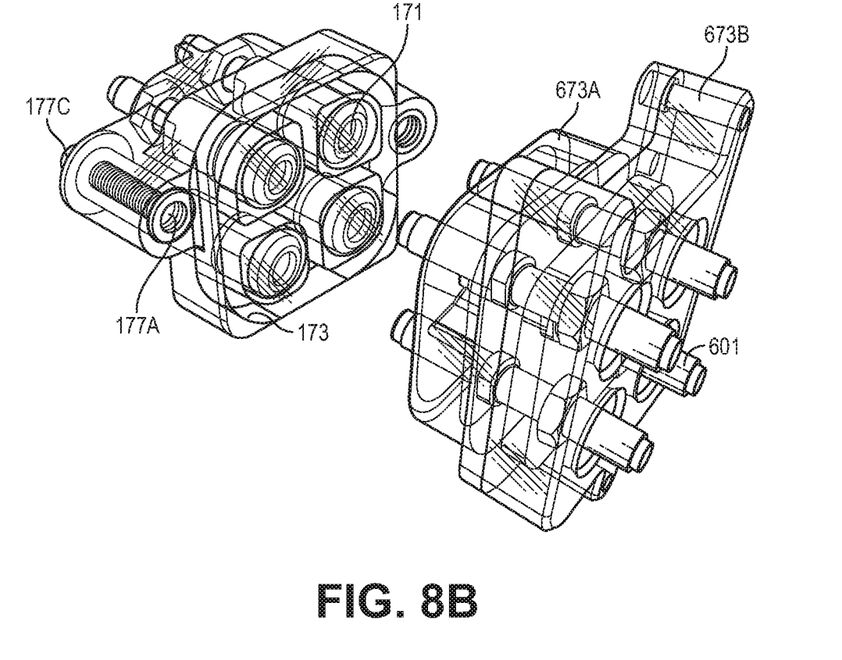
FIG. 8B is a detailed perspective view of the contact blocks and electrical sockets and pins for AC signals shown in FIG. 8A.

FIGS. 7A and 7B are detailed views of an embodiment of contact blocks and electrical sockets and pins for RF signals, and FIGS. 8A and 8B are detailed views of an embodiment of contact blocks and electrical sockets and pins for AC signals. FIGS. 7B and 8B show the contact blocks and electrical connectors in the mated position. As shown in FIG. 7A-8B, in this embodiment, the electrical sockets 171 are mounted in a contact block 173.

Similarly, the pins 601 are mounted in a contact block 673. In this embodiment, the contact block 673 comprises two parts 673A, 673B to allow the pins 601 to be replaced even after installation. That is, the rear portion of the contact block 673 is installed on the mounting block 600 of the pedestal lift 610, and the pins 601 are inserted into the rear portion 673B. The front portion 673A is then attached to the rear portion 673B after the pins 601 are positioned in place. Thus, if a pin 601 need to be replaced, the front portion 673A can be removed without removing the entire assembly from the pedestal lift mounting block 600.

The contact blocks 173, 673 are fastened to the mounting brackets 112, 600 by fasteners formed of insulating material, such as nylon. As shown in FIGS. 7A-8B, the contact blocks 173, 673 are fastened to the mounting blocks 112, 600 by a plurality of fasteners, including a nylon standoff 177A, a nylon washer 177B, and a nylon cap screw 177C. It will be understood that the self-alignment of the contact blocks 173, 673 allow some float to account for position differences of the mating side. Slightly enlarged holes and the standoffs 177A allow the contact blocks 173, 673 to float.

Figure 9:
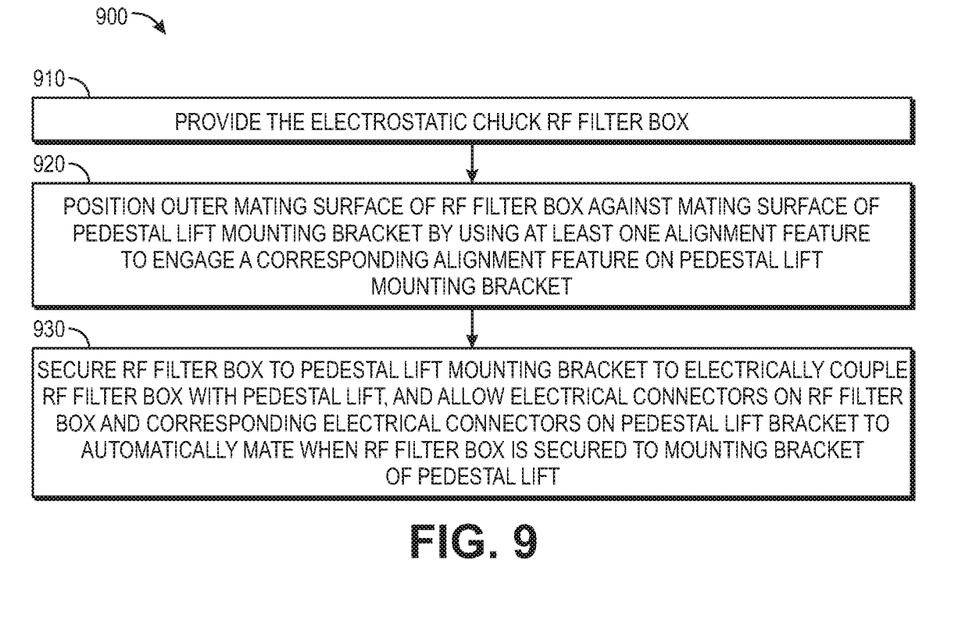
FIG. 9 is a flow chart of a method of electrically coupling an electrostatic chuck RF filter box with a pedestal lift in accordance with an embodiment.

FIG. 9 is a flow chart of a method 900 of electrically coupling an electrostatic chuck RF filter box with a pedestal lift. In Step 910, an ESC RF filter box is provided. The RF filter box includes at least one contact block and at least one alignment feature on the outer mating surface of the RF filter box. The contact block(s) include a plurality of self-aligning electrical connectors on an outer mating surface of the RF filter block and the at least one alignment feature is configured for aligning the self-aligning electrical connectors with corresponding electrical connectors on the bracket of the pedestal lift such that the self-aligning electrical connectors and the corresponding electrical connectors on the bracket of the pedestal lift automatically mate when the contact block is mounted to the bracket of the pedestal lift. In Step 920, the outer mating surface of the RF filter box is positioned against a mating surface of a mounting bracket of the pedestal lift by using the at least one alignment feature to engage a corresponding alignment feature on the mounting bracket of the pedestal lift. In Step 930, the RF filter box is secured to the mounting bracket of the pedestal lift to electrically couple the RF filter box with the pedestal lift, where the plurality of electrical connectors on the RF filter box and the corresponding electrical connectors on the bracket of the pedestal lift automatically mate when the RF filter box is secured to the mounting bracket of the pedestal lift.

What is claimed is:

1. An electrostatic chuck RF filter box, comprising:
   at least one contact block including a plurality of self-aligning electrical connectors on a mating surface of the RF filter box, wherein the mating surface is an outer surface of the RF filter box; and
   at least one alignment feature on the mating surface of the RF filter box, wherein the at least one alignment feature is configured for aligning the plurality of self-aligning electrical connectors with corresponding electrical connectors on a bracket of a pedestal lift such that the plurality of self-aligning electrical connectors and corresponding electrical connectors on the bracket of the pedestal lift automatically mate when the at least one contact block is mounted to the bracket of the pedestal lift, and wherein the at least one alignment feature on the mating surface comprises one of a protrusion or indentation configured to be mated with a corresponding one of an indentation or protrusion on the bracket of the pedestal lift.

2. The electrostatic chuck RF filter box as recited in claim 1, wherein the protrusion is a pin and the indentation is a hole, and wherein the pin is configured for insertion into the hole.

3. The electrostatic chuck RF filter box as recited in claim 1, wherein the protrusion is a keyway insert and the indentation is a keyway hole, and wherein the keyway insert is configured for insertion into the hole.

4. The electrostatic chuck RF filter box as recited in claim 1, wherein the at least one contact block is formed of an insulating material.

5. The electrostatic chuck RF filter box as recited in claim 1, wherein the at least one alignment feature on the mating surface comprises at least two alignment features on the mating surface.

6. The electrostatic chuck RF filter box as recited in claim 1, wherein the mating surface is on a mounting block of the RF filter box, and wherein the at least one contact block is fastened to the mounting block of the RF filter box by fasteners formed of insulating material.

7. The electrostatic chuck RF filter box as recited in claim 6, wherein the at least one contact block comprises a first contact block configured to filter RF signals and a second contact block configured to filter AC signals.

8. The electrostatic chuck RF filter box as recited in claim 6, wherein the mounting block of the RF filter box is configured to be mounted to the bracket of the pedestal lift.

9. The electrostatic chuck RF filter box as recited in claim 1, further comprising at least one fan assembly.

10. An electrostatic chuck RF filter box, comprising:
a first contact block configured to filter RF signals, the first contact block including a plurality of self-aligning electrical connectors on a mating surface of the RF filter box, wherein the mating surface is an outer surface of the RF filter box;
a second contact block configured to filter AC signals, the second contact block including a plurality of self-aligning electrical connectors on the mating surface of the RF filter box; and
at least one alignment feature on the mating surface of the RF filter box, wherein the at least one alignment feature on the mating surface is configured for aligning the plurality of self-aligning electrical connectors of the first and second contact block with corresponding electrical connectors on a bracket of a pedestal lift such that the plurality of self-aligning electrical connectors and corresponding electrical connectors on the bracket of the pedestal lift automatically mate when the first and second contact blocks are mounted to the bracket of the pedestal lift, and wherein the at least one alignment feature on the mating surface comprises one of a protrusion or indentation configured to be mated with a corresponding one of an indentation or protrusion on the bracket of the pedestal lift.

11. The electrostatic chuck RF filter box as recited in claim 10, wherein the protrusion is a pin and the indentation is a hole, and wherein the pin is configured for insertion into the hole.

12. The electrostatic chuck RF filter box as recited in claim 10, wherein the protrusion is a keyway insert and the indentation is a keyway hole, and wherein the keyway insert is configured for insertion into the hole.

13. The electrostatic chuck RF filter box as recited in claim 10, wherein the RF signals filtered by the first contact block comprise at least three RF signals and the AC signals filtered by the second contact block comprise at least four AC signals.

14. The electrostatic chuck RF filter box as recited in claim 10, wherein each of the self-aligning electrical connectors is a socket mounted in the first contact block or the second contact block.

15. The electrostatic chuck RF filter box as recited in claim 14, wherein each socket is configured to accept a corresponding pin on the bracket of the pedestal lift.

16. The electrostatic chuck RF filter box as recited in claim 15, wherein at least one socket has a springwire lining an inner surface of the socket for contact with a corresponding pin when the pin corresponding is inserted into the socket.

17. The electrostatic chuck RF filter box as recited in claim 10, wherein each of the self-aligning electrical connectors is a pin mounted to the first contact block or the second contact block.

18. An electrostatic chuck RF filter box, comprising:
a plurality of contact blocks configured to filter signals, each of the contact blocks including at least one self-aligning electrical connector on a mating surface of the RF filter box, wherein the mating surface is an outer surface of the RF filter box; and
at least one alignment feature on the mating surface of the RF filter box, wherein the at least one alignment feature is configured for aligning the plurality of self-aligning electrical connectors with corresponding electrical connectors on a bracket of a movable pedestal lift such that the plurality of self-aligning electrical connectors and corresponding electrical connectors on the bracket of the pedestal lift automatically mate when the plurality of contact blocks are mounted to the bracket of the pedestal lift, wherein the at least one alignment feature on the mating surface comprises one of a protrusion or indentation configured to be mated with a corresponding one of an indentation or protrusion on the bracket of the pedestal lift.

19. The electrostatic chuck RF filter box as recited in claim 18, wherein the RF filter box is configured to filter RF signals and AC signals.

* * * * *